United States Patent
Bhatnagar et al.

(10) Patent No.: US 10,832,790 B1
(45) Date of Patent: Nov. 10, 2020

(54) PERFORMANCE OF NON DATA WORD LINE MAINTENANCE IN SUB BLOCK MODE

(71) Applicant: Western Digital Technologies, Inc., San Jose, CA (US)

(72) Inventors: Shakti Bhatnagar, Bangalore (IN); Shivam Mishra, Bangalore (IN); Hitesh Golechchha, Bangalore (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/584,684

(22) Filed: Sep. 26, 2019

(51) Int. Cl.
| | |
|---|---|
| *G11C 29/00* | (2006.01) |
| *G11C 29/44* | (2006.01) |
| *G11C 16/08* | (2006.01) |
| *G11C 16/34* | (2006.01) |
| *G11C 16/16* | (2006.01) |
| *G11C 29/12* | (2006.01) |

(52) U.S. Cl.
CPC .............. *G11C 29/44* (2013.01); *G11C 16/08* (2013.01); *G11C 16/16* (2013.01); *G11C 16/3431* (2013.01); *G11C 29/848* (2013.01); *G11C 2029/1202* (2013.01)

(58) Field of Classification Search
CPC .................................. G11C 7/10; G11C 29/04
USPC ............................................. 365/189.17, 200
See application file for complete search history.

(56) References Cited

U.S. PATENT DOCUMENTS

| | | | |
|---|---|---|---|
| 8,867,271 B2 | 10/2014 | Li et al. | |
| 9,312,026 B2 | 4/2016 | Kochar et al. | |
| 9,418,751 B1 | 8/2016 | Dutta et al. | |
| 9,529,663 B1 * | 12/2016 | Srinivasan | G11C 16/3445 |
| 9,659,666 B2 | 5/2017 | Yang et al. | |
| 10,002,073 B2 | 6/2018 | Cai et al. | |
| 10,008,277 B2 | 6/2018 | Pang et al. | |
| 10,096,370 B1 * | 10/2018 | Jean | G11C 16/26 |
| 2005/0023656 A1 * | 2/2005 | Leedy | B81C 1/00238 |
| | | | 257/678 |
| 2008/0191968 A1 * | 8/2008 | Kawabe | G09G 3/3258 |
| | | | 345/55 |
| 2013/0322171 A1 * | 12/2013 | Lee | G11C 11/5628 |
| | | | 365/185.03 |
| 2014/0056173 A1 * | 2/2014 | Nakamura | H04L 69/18 |
| | | | 370/254 |
| 2014/0063944 A1 * | 3/2014 | Lee | G11C 29/52 |
| | | | 365/185.09 |
| 2014/0241092 A1 * | 8/2014 | Ha | G11C 11/5621 |
| | | | 365/218 |
| 2014/0247658 A1 * | 9/2014 | Hosono | G11C 16/08 |
| | | | 365/185.11 |

(Continued)

*Primary Examiner* — Michael T Tran
(74) *Attorney, Agent, or Firm* — Patterson & Sheridan, LLP; Steven H. Versteeg

(57) ABSTRACT

A storage device may include a controller performing non data word line (NDWL) maintenance in sub block mode (SBM). The NDWL maintenance in SBM can include proactive select gate drain (SGD) detection and phased SGD correction. For example, when a block reaches a PE cycle threshold value, SGD phased correction occurs upon detection of an error, by determining whether a sister sub block of the selected block contains data. If the sister sub block contains data, the data is transferred from the sister sub block, and then the block and sister sub block undergo correction for NDLW maintenance.

19 Claims, 8 Drawing Sheets

(56) References Cited

U.S. PATENT DOCUMENTS

| | | | | |
|---|---|---|---|---|
| 2014/0355345 | A1* | 12/2014 | Avila | G06F 11/1048 |
| | | | | 365/185.09 |
| 2015/0070994 | A1* | 3/2015 | Hosono | G11C 16/08 |
| | | | | 365/185.11 |
| 2015/0131356 | A1* | 5/2015 | Kurokawa | G11C 29/785 |
| | | | | 365/51 |
| 2016/0078946 | A1* | 3/2016 | Byun | G11C 16/0483 |
| | | | | 365/185.12 |
| 2016/0155722 | A1* | 6/2016 | Leedy | H01L 25/16 |
| | | | | 257/686 |
| 2016/0217868 | A1* | 7/2016 | Dutta | G11C 16/349 |
| 2017/0062067 | A1* | 3/2017 | Yang | G11C 16/26 |
| 2017/0084345 | A1* | 3/2017 | Yang | G11C 16/34 |
| 2017/0169895 | A1* | 6/2017 | Terabayashi | G11C 16/08 |
| 2017/0330635 | A1* | 11/2017 | Shepard | G11C 16/06 |
| 2017/0352430 | A1* | 12/2017 | Chen | G11C 16/3427 |
| 2018/0053568 | A1* | 2/2018 | Yamauchi | G06F 12/0246 |
| 2018/0233206 | A1* | 8/2018 | Yu | G11C 16/10 |
| 2018/0350446 | A1* | 12/2018 | K | G11C 29/38 |
| 2019/0006020 | A1* | 1/2019 | Sundaresan | G01R 31/50 |
| 2019/0051372 | A1* | 2/2019 | Kim | G11C 29/52 |
| 2019/0206508 | A1* | 7/2019 | Choi | G11C 11/5635 |
| 2019/0214095 | A1* | 7/2019 | Sudo | G11C 29/04 |
| 2019/0244673 | A1* | 8/2019 | Yang | G11C 16/08 |
| 2019/0259462 | A1* | 8/2019 | Lu | G11C 8/08 |
| 2019/0272871 | A1* | 9/2019 | Yang | G11C 16/10 |
| 2019/0287599 | A1* | 9/2019 | Higashi | H01L 29/78391 |
| 2020/0004453 | A1* | 1/2020 | Rori | G06F 12/0246 |
| 2020/0005871 | A1* | 1/2020 | Yang | G11C 11/5628 |

* cited by examiner

PERFORMANCE OF NON DATA WORD LINE MAINTENANCE IN SUB BLOCK MODE

BACKGROUND OF THE DISCLOSURE

Field of the Disclosure

Embodiments of the present disclosure generally relate to sub block mode (SBM). More specifically, aspects of the disclosure relate to select gate drain (SGD) detection and a phased approach for non data word line (NDWL) maintenance in SBM.

Description of the Related Art

Reliability of solid state drives (SSDs) is a key factor that distinguishes SSDs from other conventional memory arrangements. Such SSDs are required to have long term endurance and memory capabilities, especially at the end of drive service life.

In some cases, SSDs can include 3D NAND flash, which is a type of memory where the memory cells are vertically stacked in multiple layers. 3D NAND flash can increase performance and lower latency of the SSD. With each generation of 3D NAND, the number of Word Lines (WLs) increases. As a result, the concept of SBM was introduced to address issues associated with increasing the number of WLs (e.g., increased metablock size, reduced number of blocks, loss of a large portion of capacity due to a bad block, etc.).

A 3D NAND in SBM uses a single physical block as two sub blocks, which are each capable of being programmed and erased independently of the other. Because the two sub blocks share the same physical block, programming and erasing one of the two sub blocks can effect the other. Further, when operating in SBM, a shift of NDWL can place the system operation at risk, effecting the reliability of the SSD and leading to either massive erase failure or reading uncorrectable error correction code (UECC) on the WLs in a block.

Due to the challenges associated with SGD in SBM, a NDWL maintenance for SBM is needed that resolves the SGD.

SUMMARY OF THE DISCLOSURE

The present disclosure generally relates to a controller performing non data word line (NDWL) maintenance in sub block mode (SBM). The NDWL maintenance in SBM can include proactive select gate drain (SGD) detection and phased SGD correction. For example, when a block reaches a PE cycle threshold value, SGD phased correction occurs upon detection of an error, by determining whether a sister sub block of the selected block contains data. If the sister sub block contains data, the data is transferred from the sister sub block, and then the block and sister sub block undergo correction for NDLW maintenance.

In one embodiment, a storage device comprising an interface, at least one memory device, and a controller coupled to the at least one memory device configured to select an available block, initiate an erase process on the available block that includes to perform SGD maintenance on the available block, determine a SGD defect, identify a sister sub block associated with the available block, determine data is stored in the sister sub block, and transfer the data stored in the sister sub block, and erase the available block and the sister sub block.

In another embodiment, a storage device comprising an interface, at least one memory device, and a controller coupled to the at least one memory device configured to initiate SGD Vth correction, iterate through each plane in a die, determine a plane requires SGD Vth correction, determine SGD Vth program parameters changed on the plane, execute SGD Vth correction sequence on each string of the plane, and determine the SGD Vth program is successful.

In another embodiment, a storage device comprising means for initiating a proactive SGD detection for a block, means for determining a SGD defect in the block, and means for initiating a phased SGD correction.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a controller performing non data word line (NDWL) maintenance in sub block mode (SBM). The NDWL maintenance in SBM can include proactive selective gate drain (SGD) detection and phased SGD correction. For example, when a block reaches a PE cycle threshold value, SGD phased correction occurs upon detection of an error, by determining whether a sister sub block of the selected block contains data. If the sister sub block contains data, the data is transferred from the sister sub block, and then the block and sister sub block undergo correction for NDLW maintenance.

Figure 1:
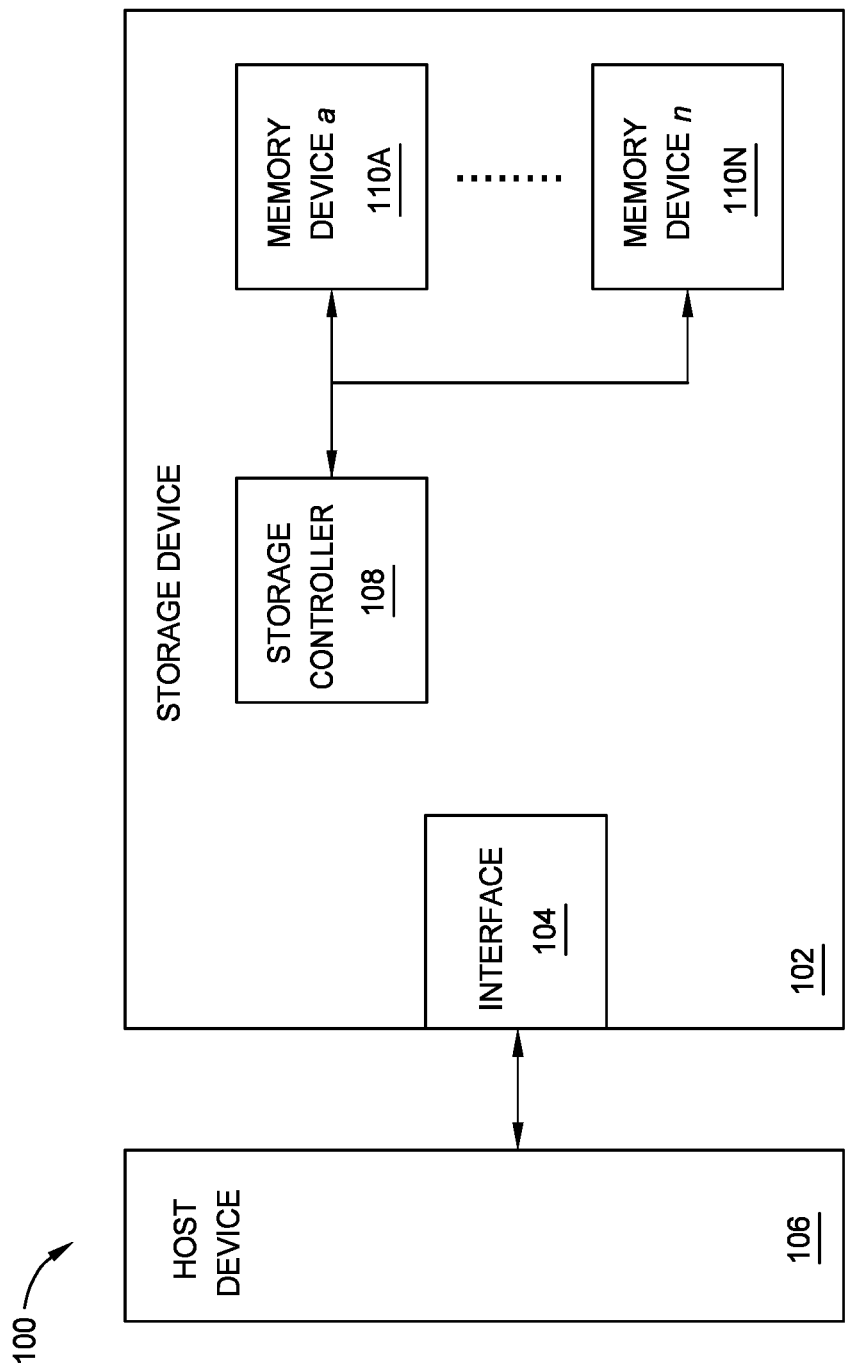
FIG. 1 is an arrangement of a host device and storage device with accompanying interface and controller.

Referring to FIG. 1, an arrangement 100 of a host device 106 and a storage device 102 is illustrated. Data may be sent and received through an interface 104 between the host device 106 and the storage device 102. The interface 104 is configured to interface with the host device 106, namely accept data and/or command requests as provided by the host device 106 for processing by the storage device 102. A storage controller 108 is provided in the storage device 102 to control either a single memory device 110A or multiple memory devices 110N. In the illustrated embodiments, the storage device 102 may be a single or number of SSDs for storage of information.

Aspects of the disclosure use the elements/components described in FIG. 1 to enable execution of several methods associated with NDWL maintenance in SBM for a SSD, which will lead to an increase in data storage reliability due to performance of proactive SGD detection and phased SGD maintenance and correction.

In aspects described, data is scanned using a sliding window approach, wherein an estimation of "0's" and "1's" data values is performed in the window. This data may be transferred as part of phased SGD maintenance and correction.

In many cases, data written to flash memory, such as NAND based SSD's, has structure to it. As described above, the memory devices 110A-110N may be based on flash memory (e.g., NAND) technology. The structure can be a property of a user source (e.g., if the saved data is textual in origin). In other embodiments, the structure can be a property of the way the NAND is used (e.g., tables written by the firmware, data padded with zeros etc.).

In some cases, the NAND is 3D such that the memory cells are stacked vertically forming a die. In such cases, the 3D NAND can operate in SBM. In SBM, one physical block of can include two sister sub blocks. The sister sub blocks, while sharing a physical block, can operate independently of each other (e.g., process and erase cycles).

Aspects of the disclosure describe performance of NDWL maintenance in SBM by proactive SGD detection and SGD maintenance to improve endurance and reliability of the 3D NAND.

Physical Block Operating in Sub Block Mode

Figure 2A:
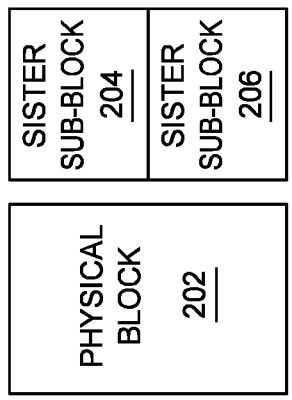
FIGS. 2A and 2B are diagrams of a physical block operating in SBM.
Figure 2B:
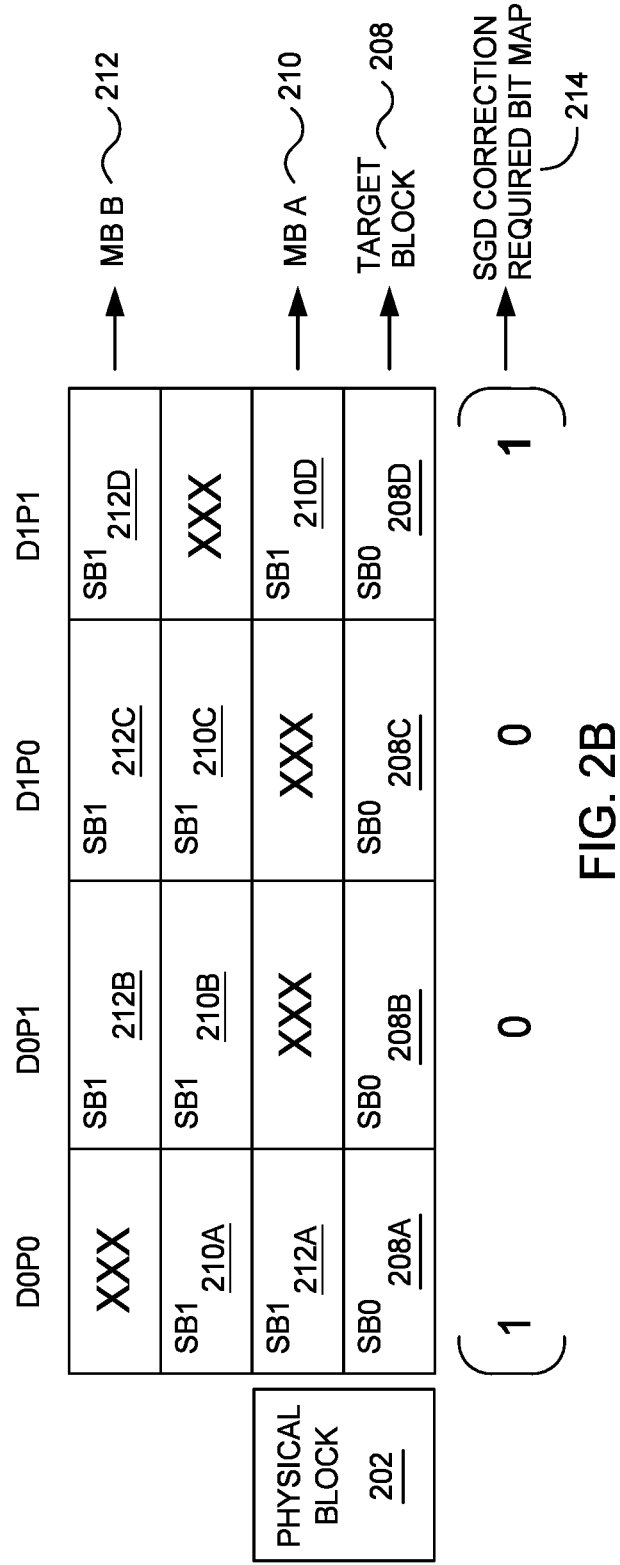

FIGS. 2A and 2B are diagrams of a physical block. In FIG. 2A, a physical block 202 is operating in SBM. In the SBM depicted, the physical block 202 has two sister sub blocks 204 and 206. Each sister sub block 204 and 206 operates independent of the other on the physical block 202. Further, since the sister sub blocks 204 and 206 share the same physical block 202, a program and erase (PE) cycle occurring on sister sub block 204, for example, can effect the other sister sub block 206, and vice versa. In some cases, the effect can occur after more than one PE cycle.

FIG. 2B is a diagram illustrating a physical block with sister sub blocks. In FIG. 2B, a target block 208 (e.g., comprising sister sub blocks 208A-D) has a different physical block due to relinking, and as a result, the target block 208 can have more than one sister sub block's metablock (MB). For example, for D0P0, the sister sub block 212A is part of MB B 212 (e.g., which comprises sister sub blocks 212A-212D). In another example, for D1P1, the sister sub block 210D is part of MB A 210 (e.g., which comprises sister sub blocks 210A-210D). Additionally, FIG. 2B illustrates the SGD correction required bit map 214 for addressing string failure in target block 208.

Shifting During PE Cycles

Figure 3:
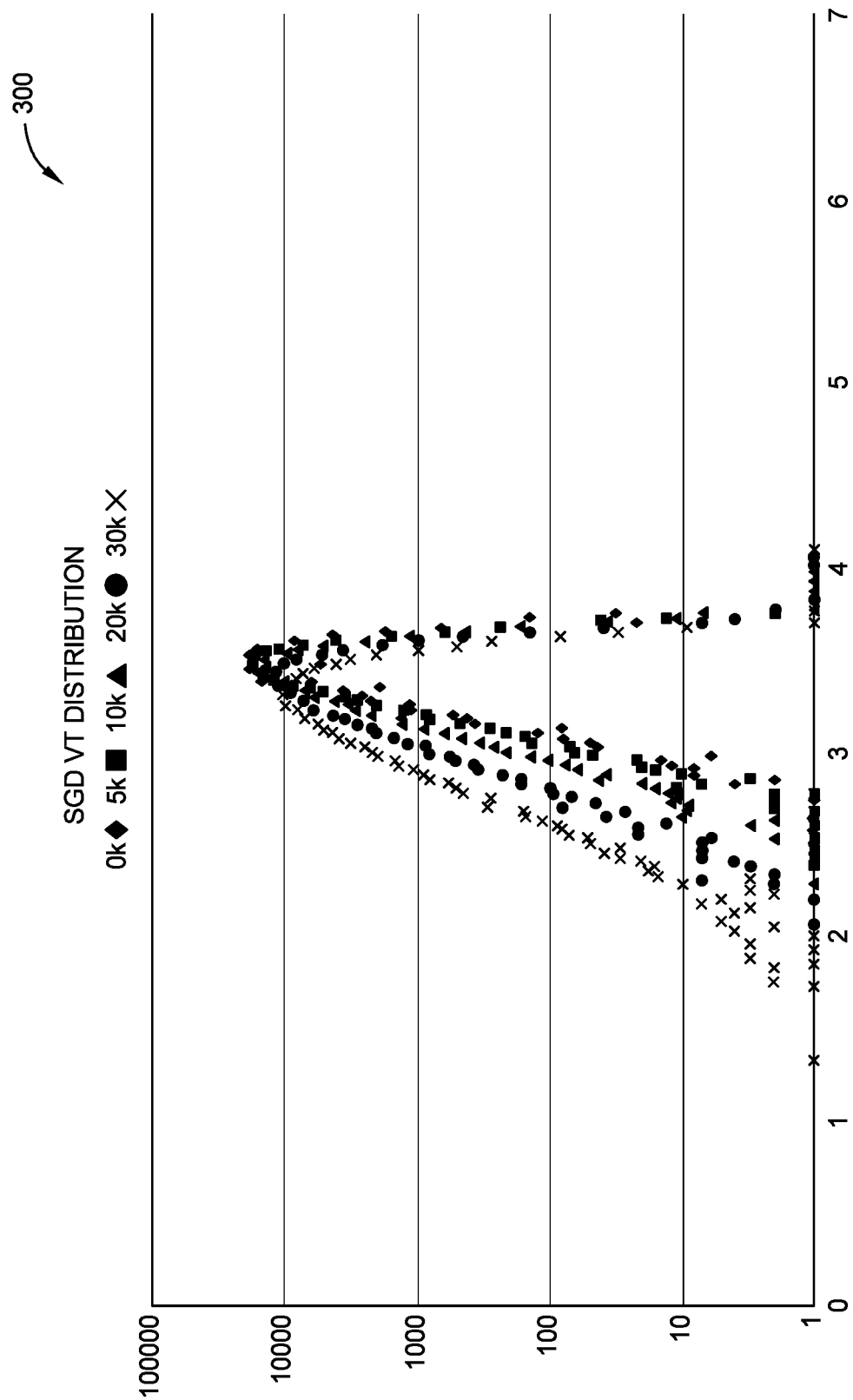
FIG. 3 is a graph of Vt distribution across PE cycles.

FIG. 3 is a graph of Vt distribution across PE cycles. In FIG. 3, the graph 300 illustrates an issue associated with SBM. In particular, the graph 300 illustrates a downshift that occurs over the PE cycles during SBM. In some cases, SGD Vt shifting can occur with each PE cycle. In such cases, the shifting can be caused either by improper trimming or due to NAND intrinsic behavior. Without proper NDWL maintenance, there is a risk that the shifting can result in a massive erase failure, a read UECC, and other similar risks effecting the stability and endurance of the NAND. As a result, a NDWL maintenance comprising proactive SGD detection and phased SGD maintenance can prevent such risks when operating in SBM.

System Level Phased Approach for NDWL Maintenance in SBM

Figure 4:
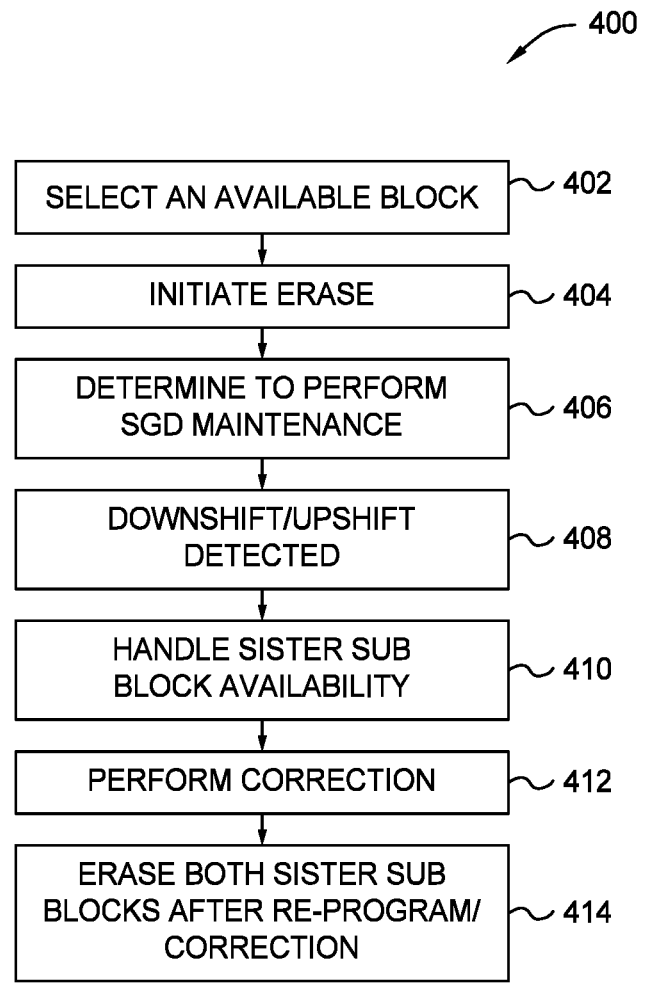
FIG. 4 is a flow chart for a method of NDWL maintenance.

FIG. 4 is a flow chart 400 for a method of NDWL maintenance. As described, the method includes proactive SGD detection and phased SGD maintenance and correction.

At 402, in SBM, a block is selected. For example, one of the sister sub blocks on a physical block is selected for a PE cycle. In some cases, the block is selected from a list (e.g., a free block list).

At 404, an erase operation is triggered for the selected block. As part of triggering the erase procedure, proactive SGD detection is initiated. For proactive SGD detection, a determination is made at 406 as to whether the SLC/TLC PE cycle matches a threshold value. The threshold value refers to the number of cycles that can performed on a block before triggering SGD maintenance for each subsequent cycle. The threshold value is a predetermined value.

In some cases, if the SLC/TLC PE cycle count for the selected block does not match the threshold value, then the selected block can continue without undergoing SGD maintenance. In other cases, if the SLC/TLC PE cycle count for the selected block does match the threshold value, then the selected block undergoes SGD maintenance to determine whether the selected block has an SGD defect. In such cases, the selected block having met the SLC/TLC PE threshold will undergo SGD maintenance for each subsequent selection of the block.

Further, each die, plane, and string of the selected block is reviewed to identify any SGD defect. For example, each string of a plane is reviewed. Once review of a plane is completed, the next plane in the die is reviewed. This continues until each plane in the die and each die is reviewed for defects.

At 408, a SGD defect is detected. For example, there can be a string failure on one of the planes. If there is a string failure, for example, due to downshifting/upshifting, then the detection is stopped on the plane that the string failure occurred and the next plane on the die is reviewed for defects. The plane that has the string failure is flagged for correction as well.

Prior to any correction of SGD defects on a block, the sister sub block at 410 is handled. During this process, the sister sub block of the selected block is identified, and a determination is made whether the sister sub block contains any valid data. If there is no valid data, the selected block and the sister sub block continue to correcting the selected block at 412. If there is valid data stored on the sister sub block, then the data is transferred, as described herein. The data transfer ensures that the sister sub block does not have any data that can be effected by performing the erase operation since the selected block and sister sub block share the same physical block.

At 412, the selected block with the SGD defect undergoes the correction process, as described herein. The correction of the SGD defect on the selected block includes changing the NAND parameters and executing a re-program sequence to re-position NDWL Vt distribution in SBM. The correction process occurs on each plane that has at least one failed string.

At 414, after completing the correction of defects on each plane, the selected block and the sister sub block is erased.

SGD Queue Handling in SBM

Figure 5:
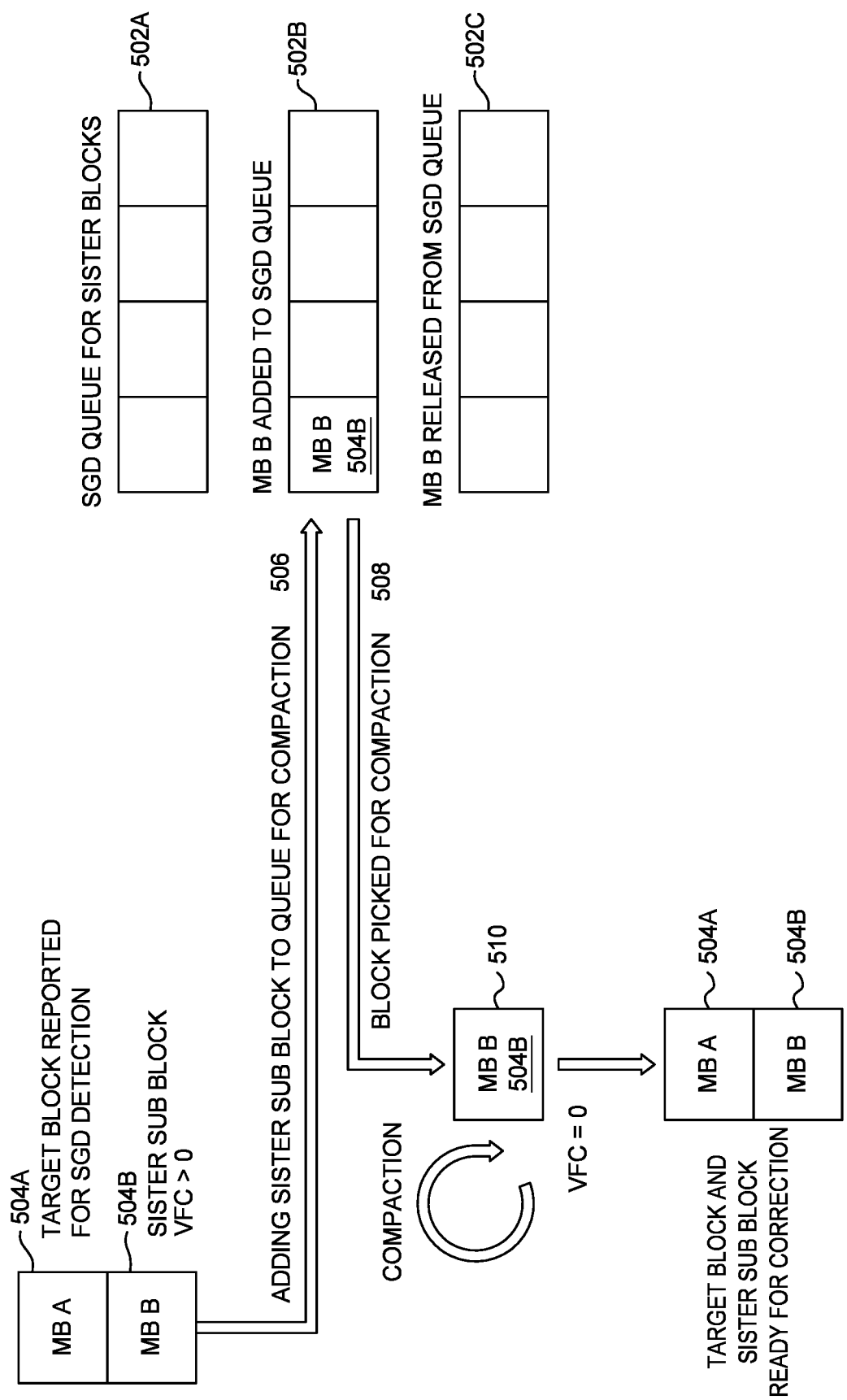
FIG. 5 is a diagram of SGD queue handling in sub block mode.

FIG. 5 is a diagram of SGD queue handling in sub block mode. As illustrated, there is a SGD queue 502A-502C for sister sub blocks. During the proactive SGD detection process, a target block 504A (e.g., metablock (MB) A) that met the SLC/TLC PE cycle threshold is reviewed for any SGD defects. If an SGD defect is identified in the target block 504A, then the sister sub block 504B is identified and checked for any valid data. If there is valid data on the sister sub block 504B, then the sister sub block 504B is moved to the SGD queue. As illustrated, the sister sub block 504B is added 506 to the SGD queue 502A-502C for compaction with the target block 504A, which includes transferring the valid data to a different block).

Once the valid data has been transferred from the sister sub block 504B, then the sister sub block is retrieved 508 for compaction at 510. Next, the target block 504A and the sister sub block 504B are ready for the correction process to address the defect detected.

The SGD queue 502A-502C is illustrated at different times. For example, SGD queue 502A illustrates the SGD queue prior to the transfer of a sister sub block 504B. SGD queue 502B illustrates the SGD queue with a sister sub block added, so that the valid data in the sister sub block can be transferred. SGD queue 502C illustrates the SGD queue once the sister sub block's data has been transferred and the sister sub block has been retrieved for compaction and correction with the target block 504A, upon which a defect is detected.

Detection of SGD Defect

Figure 6:
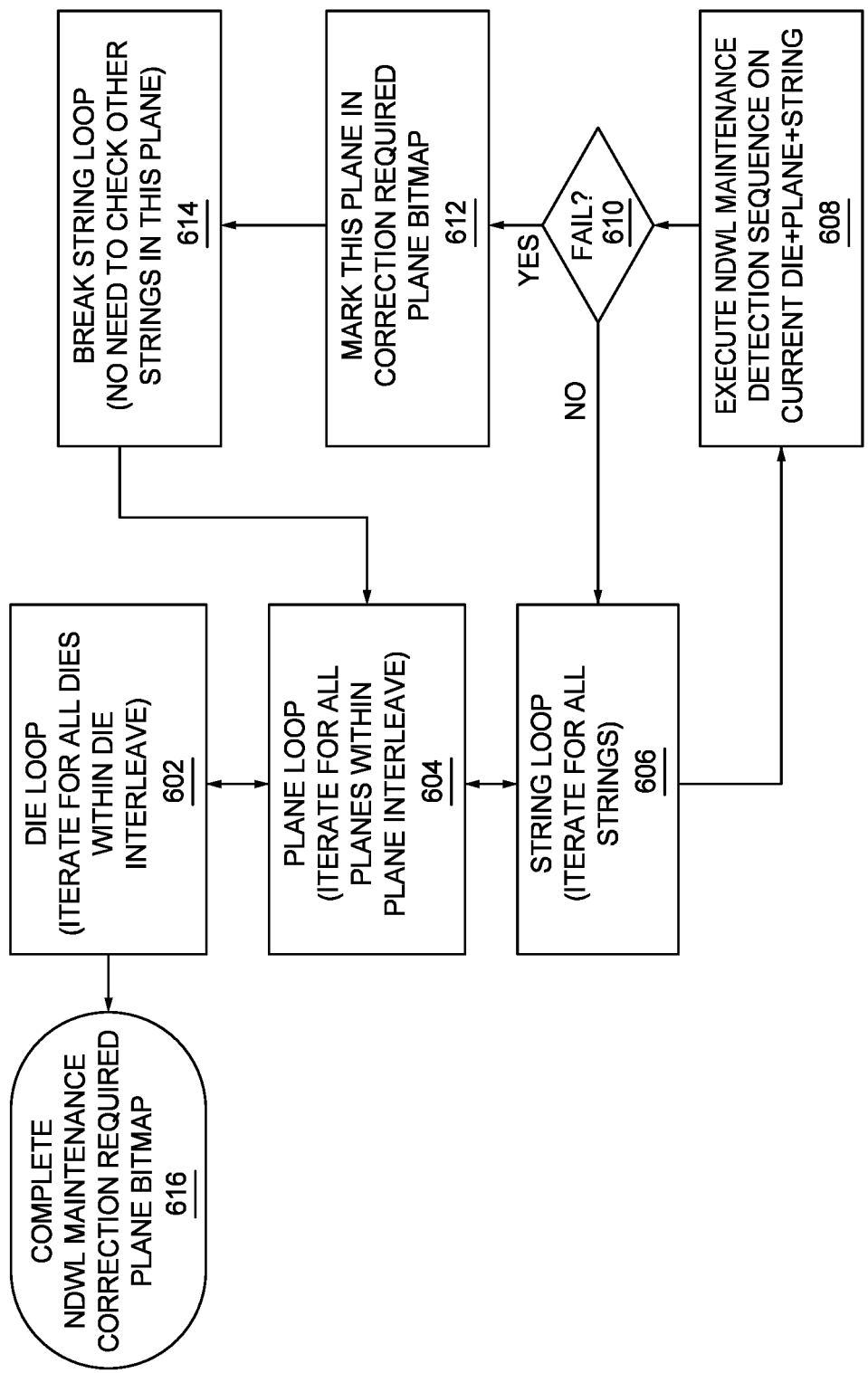
FIG. 6 is a flow chart for a method of detection of a SGD defect in sub block mode.

FIG. 6 is a flow chart for a method of detection of a SGD defect in sub block mode. In this method, each die, plane, and string is reviewed to determine whether there is a defect. Beginning at 602, a die loop is initiated. In the die loop, there is, at 604, an iteration of each plane to review, and at 606, there is a string loop, reviewing each string on the plane. During the iteration of each string on a plane, at 608, a NDWL maintenance detection sequence is executed. The NDLW maintenance detection sequence is executed on each string of each plane on each die.

At 610, a determination is made whether the execution of NDWL maintenance detection sequence failed. If the NDWL maintenance detection sequence did not fail, the string loop 606 continues until the NDWL maintenance detection sequence executed on each string of the plane. Once each string is reviewed on a plane, the plane loop at 604 continues, and the strings of next plane are reviewed by executing the NDWL maintenance detection sequence. This continues until each string on each plane of each die has successful executed the NDWL maintenance detection sequence.

In some cases, a string at 610 can fail to successful execute the NDWL maintenance detection sequence. In such cases, at 612, the plane on which the string fails to execute the NDWL maintenance detection sequence is flagged. For example, the plane can be marked on a bitmap (e.g., a correction required bitmap). Marking the plane on the map is indication that there is a defect (e.g., due the string failure) that needs correction.

Once the plane is marked at 612, the method proceeds at 614 to break the iteration (e.g., loop) of the string review on the plane. At this point, there is no further need to check the other strings on the plane because the plane is marked for correction. As such, by breaking the string loop at 614, the method continues the plane loop at 604 and die loop at 602, until each string of each plane of each die is reviewed. At 616, once each die is reviewed, the method proceeds to complete the bit map (e.g., NDWL maintenance correction required plane bitmap).

Handling a Sister Sub Block in SBM

Figure 7:
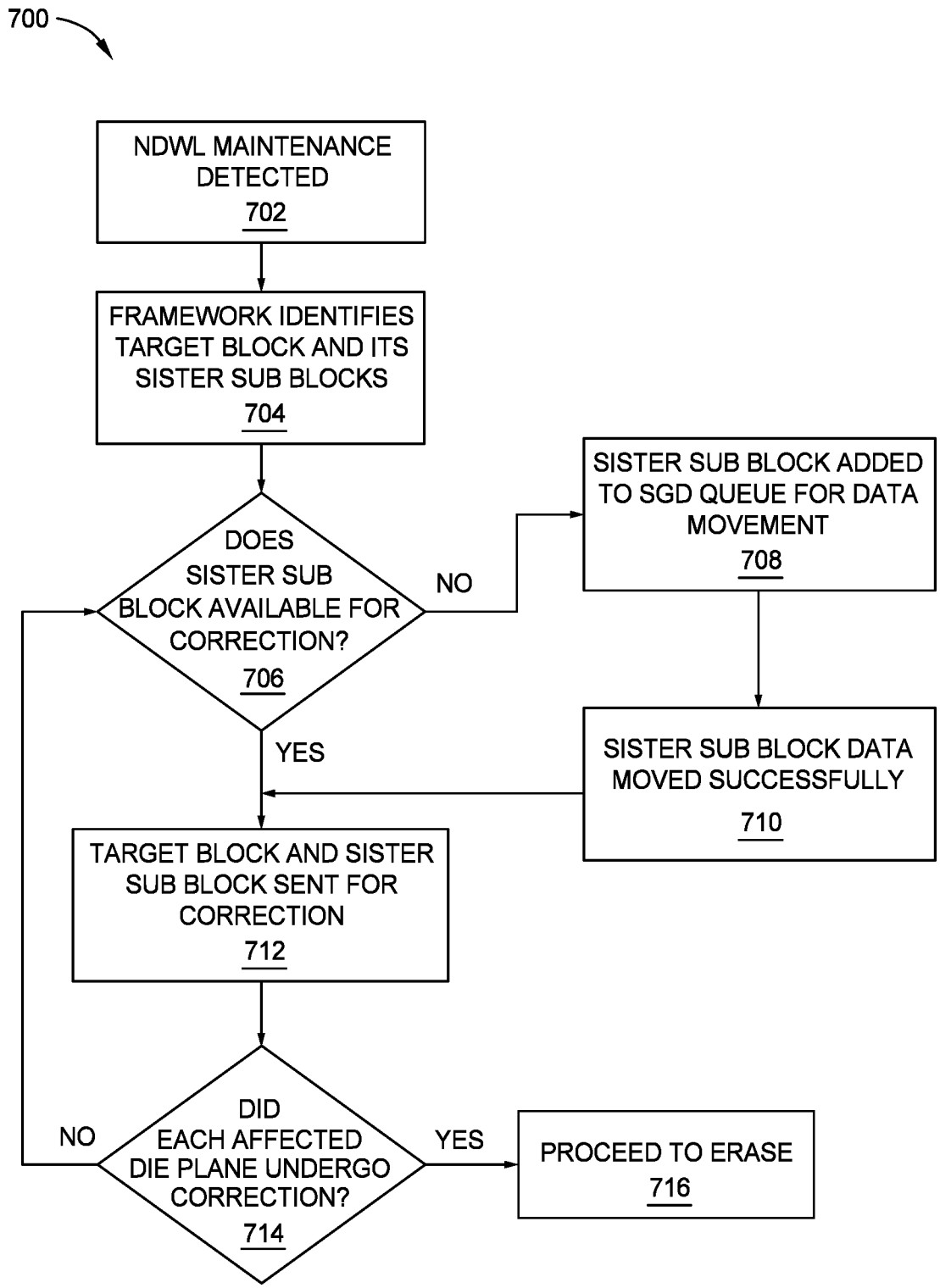
FIG. 7 is a flow diagram for a method handling a sister sub block prior to correction in sub block mode.

FIG. 7 is a flow diagram 700 for a method handling a sister sub block prior to correction in sub block mode.

At 702, NDWL maintenance is detected. At 704, a target block and sister sub block(s) are identified (e.g., by a framework of proactive SGD detection and phased SGD maintenance and correction). In some cases, a target block (e.g., a free block) is selected. For example, a target block is selected from a group of available blocks for use. Prior to using the target block, a determination is made whether the number of SLC/TLC PE cycles of the target block matches a threshold value of SLC/TLC PE cycles. If the target block does not meet the threshold value, then NDWL maintenance continues, and the target block and sister sub blocks are erased. If the target block does meet the threshold value, then phased SGD maintenance and correction for NDWL maintenance is initiated, such that each string of each plane of each die is reviewed for any string failures. If there is a string failure identified on a plane, then the target block along with the sister sub blocks undergoes a correction procedure.

As part of the correction procedure, at 706, a determination is made whether a sister sub block is available for correction. For example, the determination includes identifying any valid data on a sister sub block. In cases where there is data in the sister sub block and the sister sub block is not available for correction at the moment as the target block, then at 708, the sister sub block with valid data is added to a SGD queue in order to transfer data from the sister sub block. At 710, the data is successfully transferred from the sister sub block, making the sister sub block available at 712 with the target block to be sent for correction.

Once the target block and sister sub block are sent for correction, at 714, a determination is made whether each affected die plane underwent correction. If each affected die plane has undergone correction, then at 716, the method proceeds to an erase procedure. However, in some cases, if each string, plane, and die do not undergo the correction procedure, then returning to 706, a determination is made as to whether there is another sister sub block available for correction. In some cases, a target block can be linked to more than one sister sub block. As such, at 706, there is a determination as to whether there any available sister sub blocks for the correction procedure.

NDWL correction in SBM

Figure 8:
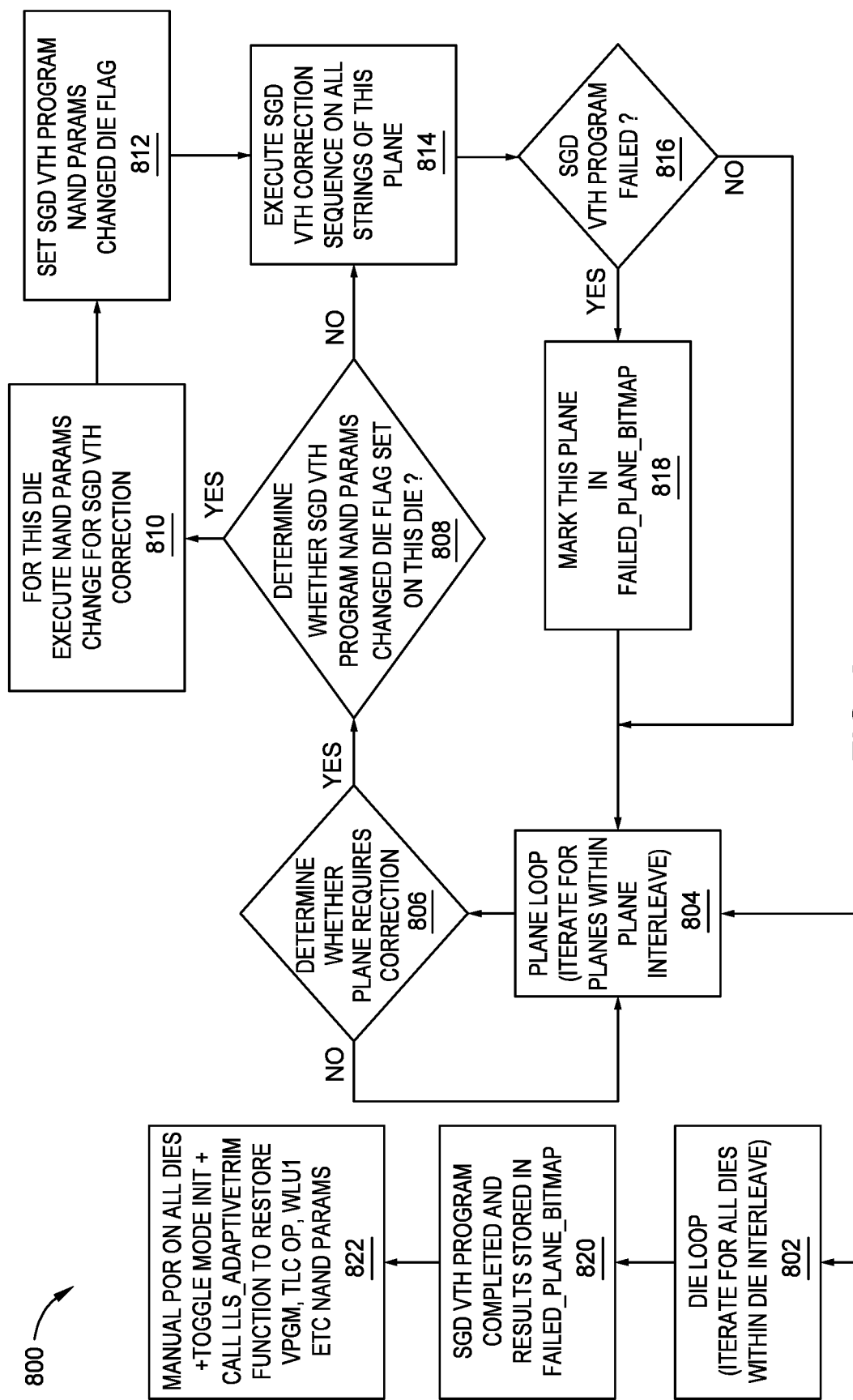
FIG. 8 is a flow diagram for a method of NDWL correction in sub block mode.

FIG. 8 is a flow diagram for a method of NDWL correction in sub block mode.

The correction procedure is based on identification of string failure on one or more planes in a target block (e.g., an available block). As such, the correction procedure is done on all strings of a failed plane. Further, the correction procedure follows a determination that the sister sub block (s) of a target block is available for correction. In such cases, the correction procedure occurs after an error (e.g., string failure) is detected during proactive SGD detection and phased SGD maintenance during NDWL maintenance. During the correction, NAND parameters are changed, and a re-program sequence is issued to re-position the NDWL Vt distribution.

At 802, a die loop is initiated in which each plane is reviewed at 804 in a plane loop to determine at 806 whether the plane is to undergo the correction procedure due to a string failure on that plane. When there is a determination that a plane requires correction, then another determination is made at 808 as to whether the die of the plane has a flag set indicating SGD Vth program NAND parameters are changed. In some cases, if the flag is not set, then the method proceeds to 814 to execute the SGD Vth correction sequence on each string of the plane. In other cases, if the flag is set, then the method proceeds to 810 to execute a change of NAND parameters for the die of the plane. The NAND parameters are changed for SGD Vth correction.

Once the NAND parameters are changed, then at 812, a flag is set indicating that the SGD Vth program NAND parameters are changed. Next, at 814, the SGD Vth correction sequence is executed on each string of the plane. At 816, there is a determination as to whether the SGD Vth program failed. If the SGD Vth program does failed, then the plane is marked on a map at 818 (e.g., a failed plane bitmap). If the SGD Vth program did not fail, the plane loop at 804 continues until there are no more planes. When the plane loop at 804 is complete, then the next die in the die loop 802 is reviewed to identify whether there is a string failure on plane.

Once each die in the die loop 802 is reviewed for plane(s) that have string failure, then at 820, the SGD Vth program is completed. In some cases, the results of the SGD Vth program are stored in a map (e.g., a plane bitmap). After the SGD Vth program is complete, at 822, the NAND parameters are restored as well as Vpgm, TLC op, and WLU1. Once correction is complete, a reset command is initiated to reset each die.

For performing NDWL maintenance in SBM, proactive SGD detection and phased SGD maintenance and correction are described herein. Performing NDWL maintenance in SBM ensures reliability of the storage device operating in SBM as well prevents massive erase failures or read UECC due to shifting NDWL.

In one non-limiting embodiment, a storage device comprising an interface, at least one memory device, and a controller coupled to the at least one memory device configured to select an available block, initiate an erase process on the available block that includes perform SGD maintenance on the available block, determine a SGD defect, identify a sister sub block associated with the available block, determine data is stored in the sister sub block, and transfer the data stored in the sister sub block, and erase the available block and the sister sub block.

In another example embodiment, the storage device may be configured wherein the performance of SGD maintenance is based on a SLC/TLC PE cycle meeting a threshold value of SLC/TLC PE cycles in the available block.

In another example embodiment, the storage device may be configured wherein the performance of SGD maintenance includes SGD defect detection for each die.

In another example embodiment, the storage device may be configured wherein the performance of SGD maintenance includes SGD defect detection for each plane of a die.

In another example embodiment, the storage device may be configured wherein the SGD defect detection for a plane stops upon a detecting a string failure.

In another example embodiment, the storage device may be configured wherein the SGD defect detection continues to a next plane for determining string failure.

In another example embodiment, the storage device may be configured wherein the available sub block is retrieved from a free block list.

In another example embodiment, the storage device may be configured wherein the determination that data is stored in the sister sub block includes adding the sister sub block to a queue.

In another example embodiment, a storage device comprising an interface, at least one memory device, and a controller coupled to the at least one memory device configured to: initiate SGD Vth correction, iterate through each plane in a die, determine a plane requires SGD Vth correction, determine SGD Vth program parameters changed on the plane, execute SGD Vth correction sequence on each string of the plane, and determine the SGD Vth program is successful.

In another example embodiment, the storage device may be configured wherein the initiation of the SGD Vth correction includes iterating through each die.

In another example embodiment, the storage device may be configured wherein the execution of the SGD Vth correction sequence includes a re-program sequence to re-position non data word line Vth distribution.

In another example embodiment, the storage device may be configured wherein results from SGD Vth program are stored in a map.

In another example embodiment, the storage device may be configured wherein upon determining the SGD Vth correction sequence failed, mark the plane in the map.

In another example embodiment, the storage device may be configured wherein the controller is configured to execute a set of NAND parameter changes for the SGD Vth correction.

In another example embodiment, the storage device may be configured wherein the determination the SGD Vth parameters are changed on the plane is based on a flag set after the execution of the set of NAND parameter changes.

In another example embodiment, a storage device comprising: means for initiating a proactive SGD detection for a block; means for determining a SGD defect in the block; and means for initiating phased SGD maintenance and correction.

In another example embodiment, the storage device may be configured wherein the means for initiating the proactive SGD detection initiates upon a SLC/TLC PE cycle meeting a threshold value for each die, each plane in the die, and each string in the plane.

In another example embodiment, the storage device may be configured wherein the means for determining the SGD defect determines a SGD defect in a plane.

In another example embodiment, the storage device may be configured wherein the means for initiating the phased SGD correction includes: means to identify a sister sub block; means to determine data in the sister sub block; and means to correct the block and the sister sub block.

In another example embodiment, the storage device may be configured wherein means for erasing the block and the sub block.

Benefits of the above-described disclosure include, but are not limited to, for example, initiating and/or performing NDWL maintenance in SBM. Additionally, proactive SGD detection and phased SGD maintenance and correction for NDWL maintenance can, for example, prevent data loss and a block from going bad. Further, proactive SGD NDWL maintenance can, for example, utilize affected blocks by performing phased SGD maintenance by setting parameters, which can guarantee safe data handling when a block goes for SGD correction. Additionally, proactive SGD detection and phased SGD maintenance and correction improves reliability (e.g., memory and product reliability) of a storage device that is operating in SBM as well prevents massive erase failures or read UECC due to shifting NDWL.

While the foregoing is directed to embodiments of the present disclosure, other and further embodiments of the disclosure may be devised without departing from the basic scope thereof, and the scope thereof is determined by the claims that follow.

What is claimed is:

1. A storage device, comprising:
    an interface;
    at least one memory device; and
    a controller coupled to the at least one memory device configured to:
        select an available block;
        initiate an erase process on the available block that includes:
            perform SGD maintenance on the available block;
            determine a SGD defect;
            identify a sister sub block associated with the available block;
            determine data is stored in the sister sub block; and
            transfer the data stored in the sister sub block; and
        erase the available block and the sister sub block.

2. The storage device of claim 1, wherein the performance of SGD maintenance is based on a SLC/TLC PE cycle meeting a threshold value of SLC/TLC PE cycles in the available block.

3. The storage device of claim 1, wherein the performance of SGD maintenance includes SGD defect detection for each die.

4. The storage device of claim 3, wherein the performance of SGD maintenance includes SGD defect detection for each plane of a die.

5. The storage device of claim 4, wherein the SGD defect detection for a plane stops upon a detecting a string failure.

6. The storage device of claim 5, wherein the SGD defect detection continues to a next plane for determining string failure.

7. The storage device of claim 1, wherein the available sub block is retrieved from a free block list.

8. The storage device of claim 1, wherein the determination that data is stored in the sister sub block includes adding the sister sub block to a queue.

9. A storage device, comprising:
    an interface;
    at least one memory device; and
    a controller coupled to the at least one memory device configured to:
        initiate SGD Vth correction;
        iterate through each plane in a die;
        determine a plane requires SGD Vth correction;
        determine SGD Vth program parameters changed on the plane;
        execute SGD Vth correction sequence on each string of the plane; and
        determine the SGD Vth program is successful.

10. The storage device of claim 9, wherein the initiation of the SGD Vth correction includes iterating through each die.

11. The storage device of claim 9, wherein the execution of the SGD Vth correction sequence includes a re-program sequence to re-position non data write line Vth distribution.

12. The storage device of claim 9, wherein results from SGD Vth program are stored in a map.

13. The storage device of claim 12, wherein upon determining the SGD Vth correction sequence failed, mark the plane in the map.

14. The storage device of claim 9, wherein the controller is configured to execute a set of NAND parameter changes for the SGD Vth correction.

15. The storage device of claim 14, wherein the determination the SGD Vth parameters are changed on the plane is based on a flag set after the execution of the set of NAND parameter changes.

16. A storage device, comprising:
    means for initiating a proactive SGD detection for a block, wherein the means for initiating the proactive SGD detection initiates upon a SLC/TLC PE cycle meeting a threshold value for each die, each plane in the die, and each string in the plane;
    means for determining a SGD defect in the block; and
    means for initiating a phased SGD maintenance and correction.

17. The storage device of claim 16, wherein the means for determining the SGD defect determines a SGD defect in a plane.

18. A storage device, comprising:
    means for initiating a proactive SGD detection for a block;
    means for determining a SGD defect in the block; and
    means for initiating a phased SGD maintenance and correction, wherein the means for initiating the phased SGD maintenance and correction includes:
        means to identify a sister sub block;
        means to determine data in the sister sub block;
        means to move the data in the sister sub block to a queue; and
        means to correct the block and the sister sub block.

19. The storage device of claim 18, further includes means for erasing the block and the sub block.

* * * * *